(12) United States Patent
Meyer et al.

(10) Patent No.: US 7,274,110 B2
(45) Date of Patent: Sep. 25, 2007

(54) SEMICONDUCTOR COMPONENT HAVING A CSP HOUSING

(75) Inventors: Thorsten Meyer, Regensburg (DE); Harry Hedler, Germering (DE)

(73) Assignee: Infineon Technologies AG, Munich (DE)

( * ) Notice: Subject to any disclaimer, the term of this patent is extended or adjusted under 35 U.S.C. 154(b) by 307 days.

(21) Appl. No.: 11/061,762

(22) Filed: Feb. 22, 2005

(65) Prior Publication Data
US 2006/0022338 A1  Feb. 2, 2006

Related U.S. Application Data

(63) Continuation of application No. PCT/EP2003/09227, filed on Aug. 20, 2003.

(30) Foreign Application Priority Data
Aug. 20, 2003 (DE) ............................. 102 38 581

(51) Int. Cl.
*H01L 23/29* (2006.01)
(52) U.S. Cl. .................. 257/790; 257/678; 257/685; 257/780; 257/781; 361/749; 361/760; 174/52.2
(58) Field of Classification Search ........ 257/E23.177, 257/E23.07, E23.065, 685, 678, 790, 676, 257/778–781, E33.059, E23.126; 174/52.2; 361/749, 760
See application file for complete search history.

(56) References Cited

U.S. PATENT DOCUMENTS

| | | | | |
|---|---|---|---|---|
| 5,394,303 A | * | 2/1995 | Yamaji | 361/749 |
| 5,736,780 A | * | 4/1998 | Murayama | 257/673 |
| 5,783,870 A | * | 7/1998 | Mostafazadeh et al. | 257/791 |
| 5,805,422 A | * | 9/1998 | Otake et al. | 361/749 |
| 5,920,118 A | | 7/1999 | Kong | |
| 5,977,621 A | | 11/1999 | Stuck | |
| 6,014,316 A | * | 1/2000 | Eide | 361/735 |
| 6,150,719 A | * | 11/2000 | Saia et al. | 257/751 |
| 6,313,532 B1 | * | 11/2001 | Shimoishizaka et al. | 257/734 |
| 6,326,700 B1 | * | 12/2001 | Bai et al. | 257/790 |
| 6,329,708 B1 | * | 12/2001 | Komiyama | 257/678 |
| 6,333,564 B1 | * | 12/2001 | Katoh et al. | 257/780 |
| 6,376,769 B1 | * | 4/2002 | Chung | 174/524 |
| 6,388,322 B1 | | 5/2002 | Goossen et al. | |
| 6,389,689 B2 | * | 5/2002 | Heo | 29/840 |
| 6,440,722 B1 | * | 8/2002 | Knapp et al. | 438/106 |
| 6,560,117 B2 | * | 5/2003 | Moon | 361/749 |

(Continued)

FOREIGN PATENT DOCUMENTS

DE    19803020 A1    9/1999

(Continued)

*Primary Examiner*—Kenneth Parker
*Assistant Examiner*—Chris C. Chu
(74) *Attorney, Agent, or Firm*—Eschweiler & Associates, LLC

(57) ABSTRACT

The invention relates to a semiconductor component for mounting on a printed circuit board. The semiconductor component includes a housing that at least partially surrounds at least one flat semiconductor chip. Electrical contacts are assigned to the semiconductor chip and serve to establish an electrical connection to electrodes provided on a printed circuit board. The flat semiconductor chip has a mounting lateral surface that includes contact surfaces configured to make contact with the electrical contacts. A buffer layer is located between the housing and the chip, and surrounds the chip up to a supporting surface located on the mounting lateral surface.

16 Claims, 3 Drawing Sheets

U.S. PATENT DOCUMENTS

| | | | |
|---|---|---|---|
| 6,646,335 B2 * | 11/2003 | Emoto .................. 257/686 |
| 6,710,437 B2 * | 3/2004 | Takahashi et al. .......... 257/690 |
| 6,724,076 B1 | 4/2004 | Kahlisch et al. |
| 6,768,191 B2 * | 7/2004 | Wennemuth et al. ....... 257/686 |
| 6,876,074 B2 * | 4/2005 | Kim .................. 257/686 |
| 6,998,704 B2 * | 2/2006 | Yamazaki et al. .......... 257/688 |
| 2002/0027298 A1 | 3/2002 | Sakamoto et al. |
| 2002/0034872 A1 | 3/2002 | Kazama et al. |
| 2002/0038890 A1 | 4/2002 | Ohuchi |
| 2003/0067755 A1 | 4/2003 | Haimerl et al. |

FOREIGN PATENT DOCUMENTS

| DE | 19954888 A1 | 5/2001 |
|---|---|---|
| DE | 10016132 A1 | 10/2001 |
| DE | 10133361 A1 | 1/2003 |
| EP | 0810655 A2 | 12/1997 |
| EP | 0875932 A2 | 11/1998 |
| EP | 1067601 A1 | 1/2001 |
| JP | 2001-210760 | 8/2001 |
| JP | 2001-237351 | 8/2001 |
| WO | WO-03/007364 A2 | 1/2003 |

\* cited by examiner

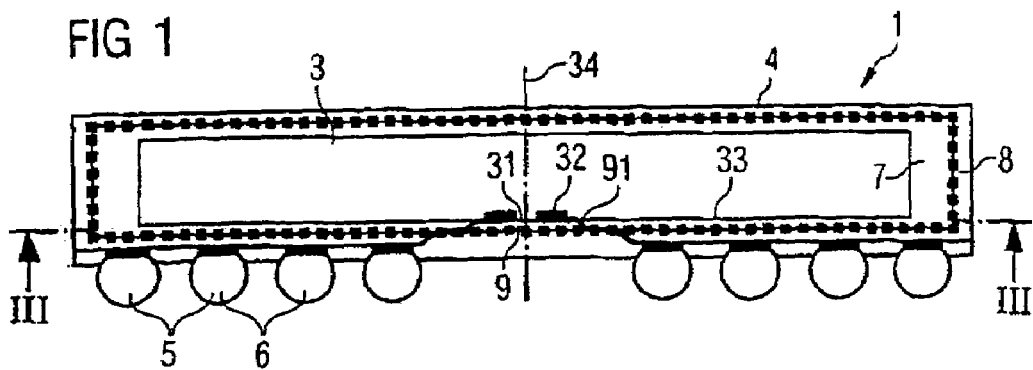
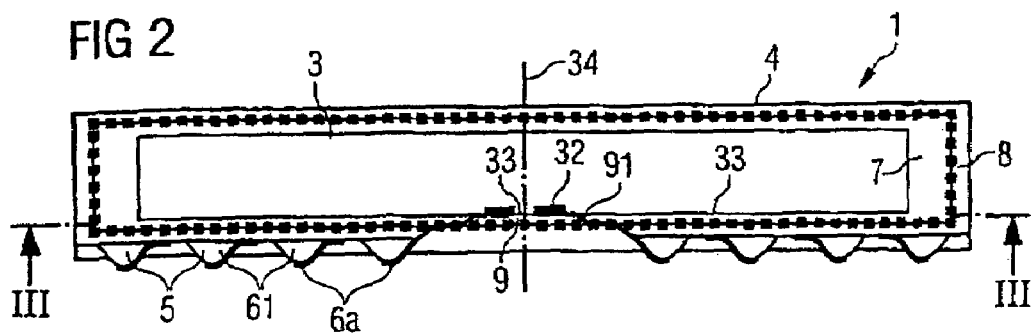
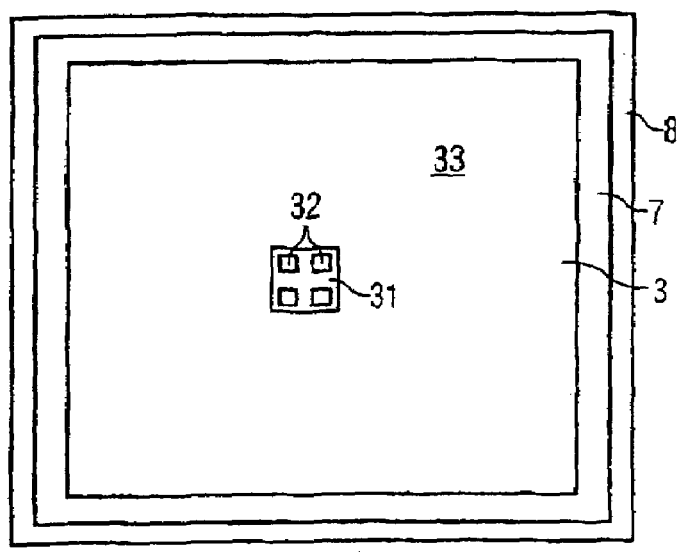

SEMICONDUCTOR COMPONENT HAVING A CSP HOUSING

The invention relates to a semiconductor component for mounting on a printed circuit board, the semiconductor component comprising a housing which housing, at least partially surrounds, the semiconductor chip being assigned electrical contacts by means of which an electrical connection to electrodes or electrode areas provided on the printed circuit board is to be produced.

In large scale integrated and greatly miniaturized semiconductor components, the problem that occurs to an intensified extent after said components have been mounted on printed circuits (printed circuit boards) is that in the event of temperature fluctuations, on account of the different thermal expansion coefficients of the materials involved, strong mechanical stresses occur within the component and between the component and the printed circuit board. FIG. 4 shows a customary design of such a miniaturized semiconductor module. The semiconductor component 1 is connected to the printed circuit board 2 by its electrical contacts 5. The semiconductor chip 3 in turn is connected to the interposer 12 by means of electrical contacts 14, the semiconductor chip being bonded to the interposer for the purpose of mechanical stabilization by means of an underfiller 13. The semiconductor chip 3 is furthermore encapsulated with an encapsulation 15. The interposer 12 as carrier is often also completely encapsulated as well.

Owing to temperature fluctuations or variations, mechanical stresses occur in the known component forms on account of the different thermal expansion coefficients of the different materials. FIG. 5 illustrates this in greater detail. The semiconductor chip 3 has a lower thermal expansion coefficient α than the interposer 12, which is produced from a different material. On account of the different expansion of the semiconductor chip and of the interposer, a strong mechanical stress 16 is transmitted via the underfiller 13, which is necessary for mechanical fixing and stabilization, and generated in the interposer 12. In order that a connection fracture of the electrical contacts 14 does not arise here, the thermal expansion coefficient of the interposer must already be adapted to the semiconductor chip. However, printed circuit boards 2 that are usually used have a thermal expansion coefficient that is greatly different from semiconductor chips. Therefore, the interposer 12, which is already under mechanical stress, exerts a strong mechanical stress 17 on the printed circuit board 2 via the electrical contacts 5 strained by said interposer. In the extreme case, this strong mechanical strain can lead to a deformation of the printed circuit board, which, particularly in the case of double-sided population of printed circuit boards, may lead to the fracture of electrical contacts 5 and thus to the destruction of the electronic apparatus. If the deformation does not immediately lead to fracture, in the course of many instances of strain and strain relief it will then lead to fatigue of the material of the electrical contacts 5, however, which then again ultimately leads to the fracture thereof and limits the service life. Moreover, the high degree of different expansion, and thus the mechanical strain, of the semiconductor component in itself, that is to say on the one hand between semiconductor chip and interposer, and semiconductor chip and encapsulation—in which a strain 18 is again induced—on the other hand, leads to fatigue of the electrical contacts 14, as a result of which the electrical contacts within the semiconductor components 1 may also be destroyed.

Direct placement of a semiconductor chip onto a printed circuit board only by means of bumps, in order to prevent mechanical stresses or transmissions thereof from interposed layers, does not achieve the goal either since a permanently stable mechanical connection between the semiconductor chip and the printed circuit board cannot be produced by this means. Moreover, adhesive bonding of a chip by means of bumps with an underfiller, for example in the form of an epoxy adhesive, would here only carry the direct strains from the semiconductor chip to the printed circuit board. This would again result in deformation of the printed circuit board, with the abovementioned difficulties. In particular, in the case of printed circuit boards populated on both sides, it would lead to a destruction of circuits situated on one side of a printed circuit board or of the electrical contacts of said circuits.

In order that electronic circuits with a sufficiently long life can nevertheless be produced, complicated and thus expensive housing constructions are necessary for semiconductor components.

Therefore, it is an object of the invention to provide a semiconductor component in which the above mentioned disadvantages do not occur and in which the very compact design is nevertheless made possible.

The object is achieved by means of the characterizing features of claim 1.

The invention provides for the planar semiconductor chip to have a mounting side area, electrical contact areas for contact with the electrical contacts being provided on the mounting side area, the semiconductor chip being surrounded by a buffer layer except for a supporting area arranged on the mounting side area, which buffer layer is situated between the housing and the semiconductor chip, which supporting area is significantly smaller than the mounting side area.

The invention proposes decoupling, as it were, the semiconductor chip by means of the small supporting area and the thus small spatial contact with respect to the materials having an unfavorable thermal expansion coefficient, as a result of which the semiconductor chip can expand within the housing to a lesser or greater extent than the surrounding housing or the printed circuit board on which the semiconductor component is fixed, without bringing about mechanical stresses. In this case, a mechanical stabilization of the chip is ensured in its position on the printed circuit board by means of the housing. This enables an adaptation to the thermomechanical properties of printed circuit board material, which enables a permanent, strain-free connection between printed circuit board (for example printed circuit) and semiconductor component.

A preferred refinement of the invention provides for the semiconductor chip to be mechanically supported on a support base shaped from the housing on the supporting area arranged on the mounting side area.

Preferably, the semiconductor chip is mechanically fixedly connected to a support base shaped from the housing on the supporting area arranged on the mounting side area.

The supporting area is advantageously arranged centrally in the mounting side area.

One refinement of the invention provides for the housing to completely surround the semiconductor chip.

A preferred refinement of the invention provides for the semiconductor component to be produced in a WLP ("wafer level package"), flip-chip or CSP design ("chip scale package").

The electrical contacts are advantageously formed by bumps.

Advantageously, and therefore preferably, the diameter G of the buffer layer between the housing of a side area of the semiconductor chip is at least $$G := C \cdot \frac{\alpha_F - \alpha_C}{\alpha_G - \alpha_F}$$

where G is the diameter of the buffer layer between the housing and a side area of the semiconductor chip, C is the length of the solder from the side area to the central point of the semiconductor chip, $\alpha_C$ is the thermal expansion coefficient of the semiconductor chip, $\alpha_G$ is the thermal expansion coefficient of the buffer layer and $\alpha_F$ is the thermal expansion coefficient of the housing.

It is likewise advantageously provided, in accordance with one refinement of the invention, that the material of the buffer layer is chosen such that the thermal expansion coefficient of the buffer layer is greater than the thermal expansion coefficient of such printed circuit board material on which the semiconductor component is to be fixed. Accordingly, the material is chosen such that the buffer layer corresponds to the lower thermal expansion coefficients of the semiconductor material, for example silicon, of the semiconductor chip such that both together correspond to the thermal expansion coefficient of the housing or the printed circuit board.

Accordingly, one refinement of the invention provides for the buffer layer to be highly elastic.

According to a preferred refinement of the invention, the material of the housing is chosen such that the thermal expansion coefficient of the housing is equal to that of such printed circuit board material on which the semiconductor component is to be fixed.

A particularly preferred refinement of the invention provides for the material of the housing to be chosen such that the thermal expansion coefficient of the housing is greater than that of the semiconductor chip.

Accordingly, one refinement of the invention provides for the material of the buffer layer and of the semiconductor chip to be chosen such that the thermal expansion coefficient thereof together is equal to that of the housing and/or to that of such printed circuit board material on which the semiconductor component is to be fixed.

Further advantages, special features and expedient developments of the invention emerge from the further subclaims or subcombinations thereof.

The invention is explained in more detail below with reference to the drawing, in which:

FIG. 1 shows a semiconductor component according to the invention for mounting on a printed circuit board, FIG. 2 shows a semiconductor component according to the invention according to a second embodiment, FIG. 3 shows the semiconductor component from FIGS. 1 and 2 in viewing direction III.

In the figures, identical reference symbols designate identical or identically acting elements.

Figure 4:
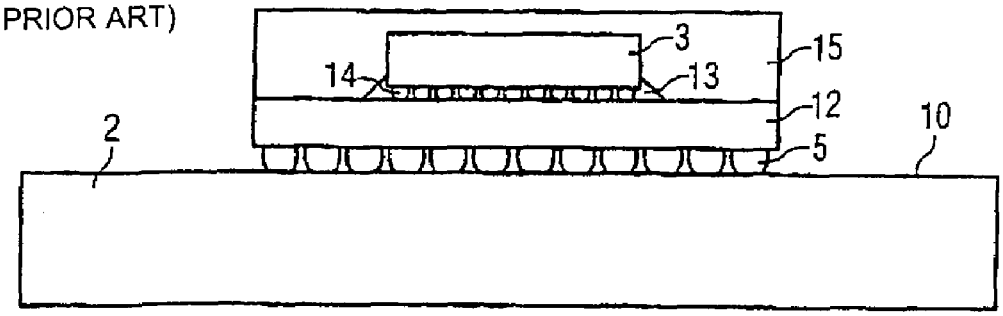
FIG. 4 shows a conventional semiconductor component mounted on a printed circuit board.
Figure 5:
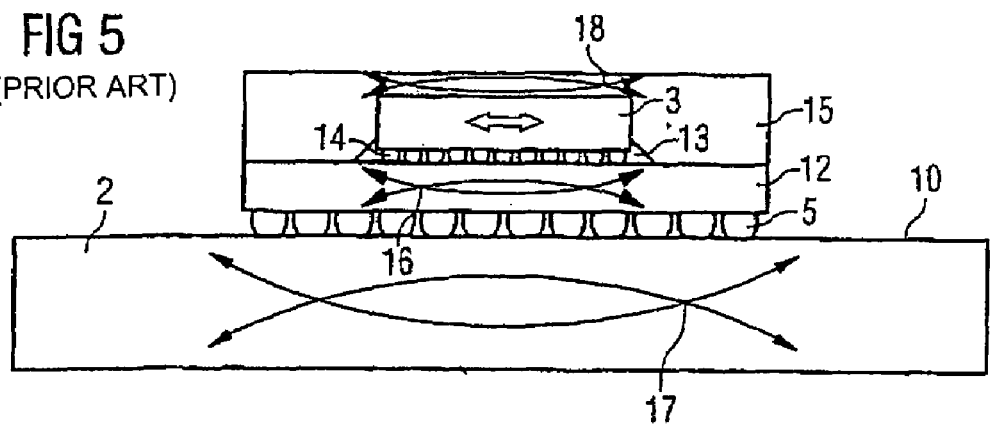
FIG. 5 shows a diagrammatic illustration of strains of a conventional semiconductor component on a printed circuit board.

FIG. 1 diagrammatically shows a semiconductor component 1 according to the invention for mounting on a printed circuit board. In this case, the semiconductor chip 3 is completely encapsulated by the housing 8 for protection from external effects. Within the housing 8, the semiconductor chip 3 is surrounded with a buffer layer 7 except for the region of the supporting area 31. Within the supporting area 31, the semiconductor chip 3 is connected via electrical contact areas 32 via line feeds to the electrical contacts 5 in the form of bumps 6 (small solder balls, "solder bumps"), via which the electrical contact is made with the electrode areas provided for this purpose on the printed circuit board surface of the printed circuit board (not illustrated).

The semiconductor chip 3 itself is connected to the housing 8 mechanically only by at the supporting area 31. Otherwise, the semiconductor chip is embedded softly in the elastic buffer layer, thus precluding a strain with the housing and resultant deformation of the external dimensions of the semiconductor component.

Therefore, the different thermal expansion coefficients α of semiconductor chip and printed circuit board do not lead to strains since the different expansion between printed circuit board and semiconductor chip 3 is cushioned by means of the sufficiently compliant buffer layer 7. Moreover, the different expansion between semiconductor chip 3 and housing 8 no longer loads the inner contacts 32 since, by virtue of the central arrangement of the contacts in a narrow region of the total area of the chip, a temperature-dictated expansion with respect to the housing no longer leads to, dislocations. Fatigue of the electrical contacts inside the semiconductor component and also on the outside of the semiconductor component is no longer brought about as a result of this. The service life is significantly increased.

FIG. 2 shows another exemplary embodiment of a semiconductor component 1, in which the electrical contacts are formed by so-called Compliant Bumps 61. In this case, the actual bumps 61 are formed by silicone shapings which, in the example for contact-making purposes, are coated with a thin, highly flexible material strip 6a in order to enable the electrical contacts.

FIG. 3 shows a view in viewing direction III from FIGS. 1 and 2. The supporting area 31, within which the electrical contact areas 32 are also situated, is significantly smaller than the mounting side area 33 and is situated in the center thereof.

Figure 6:
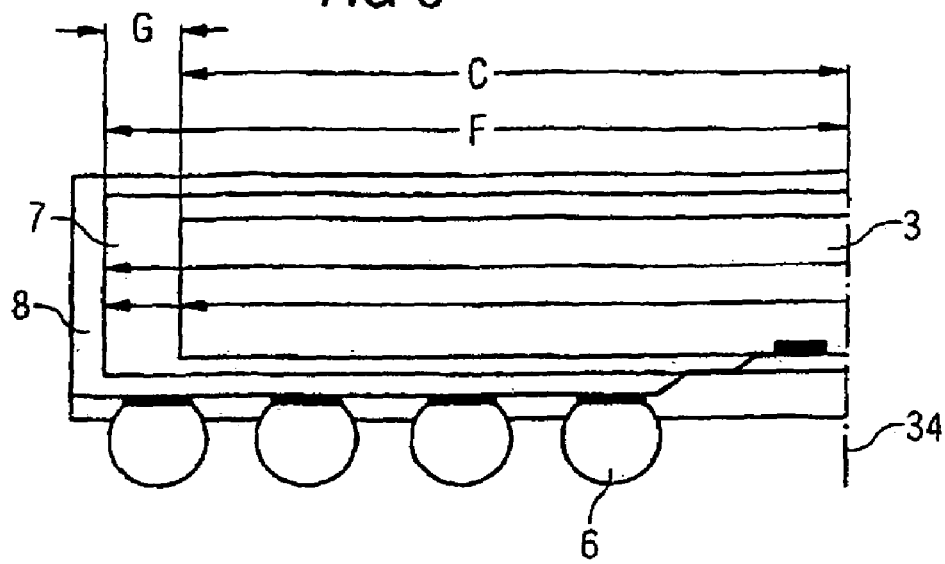
FIG. 6 shows a detail view of the semiconductor component from FIG. 1.

FIG. 6 shows once again in more detailed fashion an excerpt from FIG. 1, the dimensioning of the layer thicknesses being determined according to the relationship $$G := C \cdot \frac{\alpha_F - \alpha_C}{\alpha_G - \alpha_F},$$

where $\alpha_C$ is the thermal expansion coefficient of the semiconductor chip, $\alpha_G$ is the thermal expansion coefficient of the buffer layer 7, and $\alpha_F$ is the thermal expansion coefficient of the housing. C is the distance between the side area and the central axis 34. G represents the minimum value in this case, while F represents the distance from the central axis 34 to the outer edge of the buffer layer 7.

Figure 7:
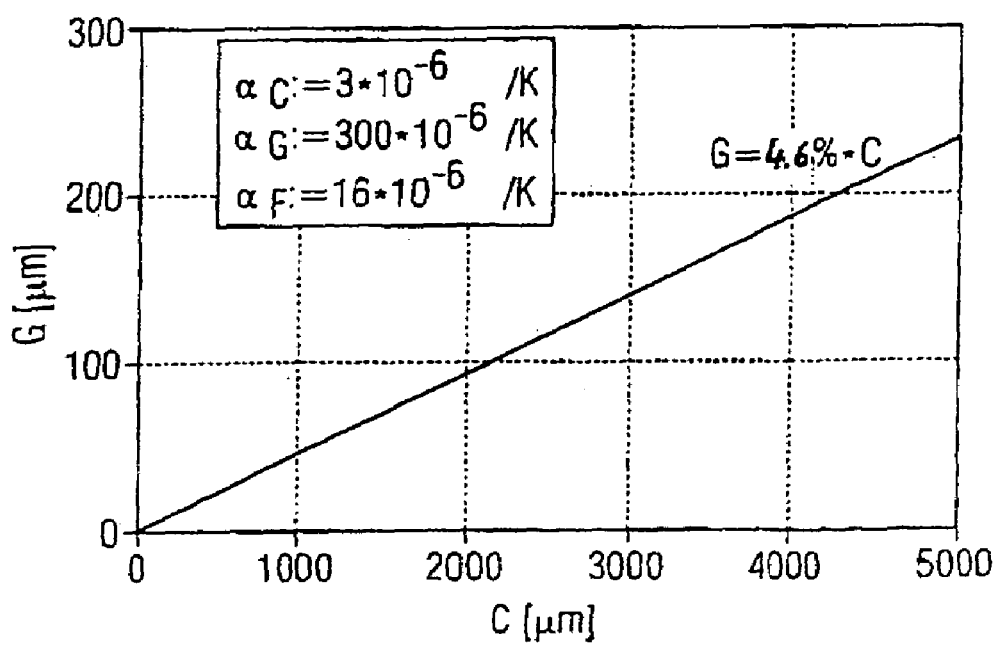
FIG. 7 shows a diagram of the dimensioning of the elements of the semiconductor component.

FIG. 7 shows, by way of example, a diagram in which the thickness G of the buffer layer is plotted against half the semiconductor chip diameter C. The gradient of 8.7% results in this case from the assumed values for the thermal expansion coefficients as:

$\alpha_C := 3 \cdot 10^{-6}/K$ $\alpha_G := 300 \cdot 10^{-6}/K$ $\alpha_F := 16 \cdot 10^{-6}/K$

LIST OF REFERENCE SYMBOLS 1 semiconductor component
2 printed circuit board
3 semiconductor chip
31 supporting area
32 electrical contact area
33 mounting side area
34 central axis
4, 8 housing
5 electrical contacts
6 bumps
61 compliant bumps
6a metal strip
7 buffer layer
9 support base
91 line feeds
10 surface of the printed circuit board
12 interposer
13 underfiller
14 electrical contacts
15 encapsulation
16 to 18 mechanical stress

The invention claimed is:

1. Semiconductor component for mounting on a printed circuit board, the semiconductor component having a semiconductor chip formed in planar fashion, the semiconductor chip being assigned electrical contacts by means of which an electrical connection to electrodes or electrode areas provided on the printed circuit board is to be produced, the planar semiconductor chip having a mounting side area, electrical contact area for contact with the electrical contacts being provided on the mounting side area, a supporting area being applied on the mounting side area, the supporting area being significantly smaller than the mounting side area, the semiconductor component having a housing, and the semiconductor component having a buffer layer between the housing and the semiconductor chip characterized in that the housing completely surrounds the semiconductor chip and the buffer layer surrounds the semiconductor chip except for a region around the supporting area.

2. Semiconductor component according to claim 1, characterized in that the semiconductor chip is mechanically supported on a support base shaped from the housing on the supporting area arranged on the mounting side area.

3. Semiconductor component according to claim 1, characterized in that the semiconductor chip is mechanically fixedly connected to a support base shaped from the housing on the supporting area arranged on the mounting side area, and the base serves for feeding line feeds from the electrical contacts to the electrical contact areas.

4. Semiconductor component according to claim 1, characterized in that the supporting area is arranged centrally in the mounting side area.

5. Semiconductor component according to claim 1 characterized in that the supporting area is arranged at the geometric centroid of the mounting side area.

6. Semiconductor component according to claim 1, characterized in that the semiconductor component is produced in a WLP ("wafer level package"), flip chip or CSP design ("chip scale package").

7. Semiconductor component according to claim 1, characterized in that the electrical contacts are formed by bumps.

8. Semiconductor component according to claim 1, characterized in that the bumps are small solder balls ("solder bumps").

9. Semiconductor component according to claim 1 characterized in that the bumps are silicone bumps with electrical conducting areas lead over them for contact-making purposes or electrically conductive bumps essentially composed of silicone ("compliant bumps").

10. Semiconductor component according to claim 1, characterized in that the diameter G of the buffer layer between the housing of a side area of the semiconductor chip is at least $$G := C \cdot \frac{\alpha_F - \alpha_C}{\alpha_G - \alpha_F}$$

where G is the diameter of the buffer layer between the housing and a side area of the semiconductor chip, C is the length of the solder from the side area to the central point of the semiconductor chip, $\alpha_C$ is the thermal expansion coefficient of the semiconductor chip, $\alpha_G$ is the thermal expansion coefficient of the buffer layer and $\alpha_F$ is the thermal expansion coefficient of the housing.

11. Semiconductor component according to claim 1, characterized in that the material of the buffer layer is chosen such that the thermal expansion coefficient of the buffer layer is greater than the thermal expansion coefficient of such printed circuit board material on which the semiconductor component is to be fixed.

12. Semiconductor component according to claim 1, characterized in that the buffer layer is highly elastic.

13. Semiconductor component according to claim 1, characterized in that the material of the housing is chosen such that the thermal expansion coefficient of the housing is equal to that of such printed circuit board material on which the semiconductor component is to be fixed.

14. Semiconductor component according to claim 1, characterized in that the material of the housing is chosen such that the thermal expansion coefficient of the housing is greater than that of the semiconductor chip.

15. Semiconductor component according to claim 1, characterized in that the buffer layer is composed of a polymer, in particular silicone or polyurethane.

16. Semiconductor component according to claim 1, characterized in that the buffer layer is composed of a foamed material.

* * * * *